(12) United States Patent
Gattuso

(10) Patent No.: US 7,520,754 B1
(45) Date of Patent: Apr. 21, 2009

(54) SOCKET CONNECTOR WITH CONTACTS

(75) Inventor: Andrew Gattuso, Chandler, AZ (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/154,733

(22) Filed: May 27, 2008

(51) Int. Cl.
*H01R 12/00* (2006.01)

(52) U.S. Cl. .......................... 439/66; 439/700; 439/841; 324/754

(58) Field of Classification Search .................... 439/66, 439/700, 841; 324/754, 761, 757
See application file for complete search history.

(56) References Cited

U.S. PATENT DOCUMENTS

| | | | |
|---|---|---|---|
| 6,677,772 B1* | 1/2004 | Faull | 324/761 |
| 6,814,626 B2* | 11/2004 | Wen-Yao | 439/700 |
| 7,025,602 B1 | 4/2006 | Hwang | |
| 7,256,593 B2* | 8/2007 | Treibergs | 324/754 |
| 7,285,026 B1* | 10/2007 | Ju et al. | 439/700 |
| 7,300,288 B1* | 11/2007 | Chen et al. | 439/66 |
| 2008/0214063 A1* | 9/2008 | Hsiao et al. | 439/841 |

* cited by examiner

*Primary Examiner*—Briggitte R Hammond
(74) *Attorney, Agent, or Firm*—Wei Te Chung

(57) ABSTRACT

A socket connector, adapted for electrically connecting an IC package and a printed circuit board, comprises a plurality contacts, an upper housing and a lower housing. The contact has a top contact, a bottom contact and a spring disposed between the top contact and the bottom contact. The top contact has a keeping portion formed with a front piece, a rear piece facing to the front piece and a bend portion connecting bottom edges of the front piece and the rear piece, and defines a guiding slot between the front piece and the rear piece. The bottom contact is inserted into the top contact and movable along the guiding slot. The lower housing defines a plurality of through gaps for receiving the bottom contacts; and the upper housing is mounted upon the lower housing and defines a plurality of receiving slots for receiving the top contacts.

14 Claims, 8 Drawing Sheets

US 7,520,754 B1

SOCKET CONNECTOR WITH CONTACTS

BACKGROUND OF THE INVENTION

1. Field of the Invention

The present invention relates to a socket connector which is used for connecting an electronic package, such as a central processing unit (CPU), with a circuit substrate, such as a printed circuit board (PCB).

2. Description of the Prior Art

U.S. Pat. No. 7,025,602, published on Apr. 11, 2006, relates to a contact for connecting an electronic package with a printed circuit board (PCB). The contact has a top contact pin, a bottom contact pin coupled to the top contact pin, and a spring fitted over a predetermined area between the top contact pin and the bottom contact pin. The top contact pin includes a contact part having a predetermined shape and contacting a lead of an object to be tested, that is, an integrated circuit (IC), two support protrusions and a body. The bottom contact pin have the same construction as that of the top contact pin, the top contact pin and the bottom contact pin are coupled to be aligned in an orthogonal orientation to each other. Open ends of the contact pins are also aligned in opposite directions along the longitudinal axis of the contact pins. Each open end forms two contact beams with a gap therebetween, the gaps are used for guiding the top and the bottom contact pins moving toward each other. However, the contact beams are easily damaged after frequent use.

Accordingly, a new socket connector that solves the above problems is desirable.

SUMMARY OF THE INVENTION

Accordingly, an object of the present invention is to provide a socket connector, which is capable of reliably transmitting electrical signals.

To fulfill the above object, a socket connector for electrically connecting an IC package and a printed circuit board, comprises a plurality of contacts, a lower housing and an upper housing mounted upon the lower housing. Each contact has a top contact, a bottom contact and a spring. The top contact is formed with a keeping portion and a main body upwardly extending from the keeping portion. The keeping portion has a rear piece, a bend portion forwardly and upwardly bending from a bottom edge of the rear piece and a front piece upwardly extending from the bend portion to face to the rear piece and defines a guiding slot between the front piece and the rear piece. The bottom contact is assembled to the top contact and movable along the guiding slot of the top contact. The spring is disposed between the top contact and the bottom contact. The lower housing defines a plurality of through gaps for receiving the bottom contacts; and the upper housing defines a plurality of receiving slots for receiving the top contacts.

Other objects, advantages and novel features of the present invention will become more apparent from the following detailed description when taken in conjunction with the accompanying drawings, in which:

DESCRIPTION OF PREFERRED EMBODIMENTS OF THE INVENTION

Reference is now made to the drawings to describe the invention in detail.

Figure 1:
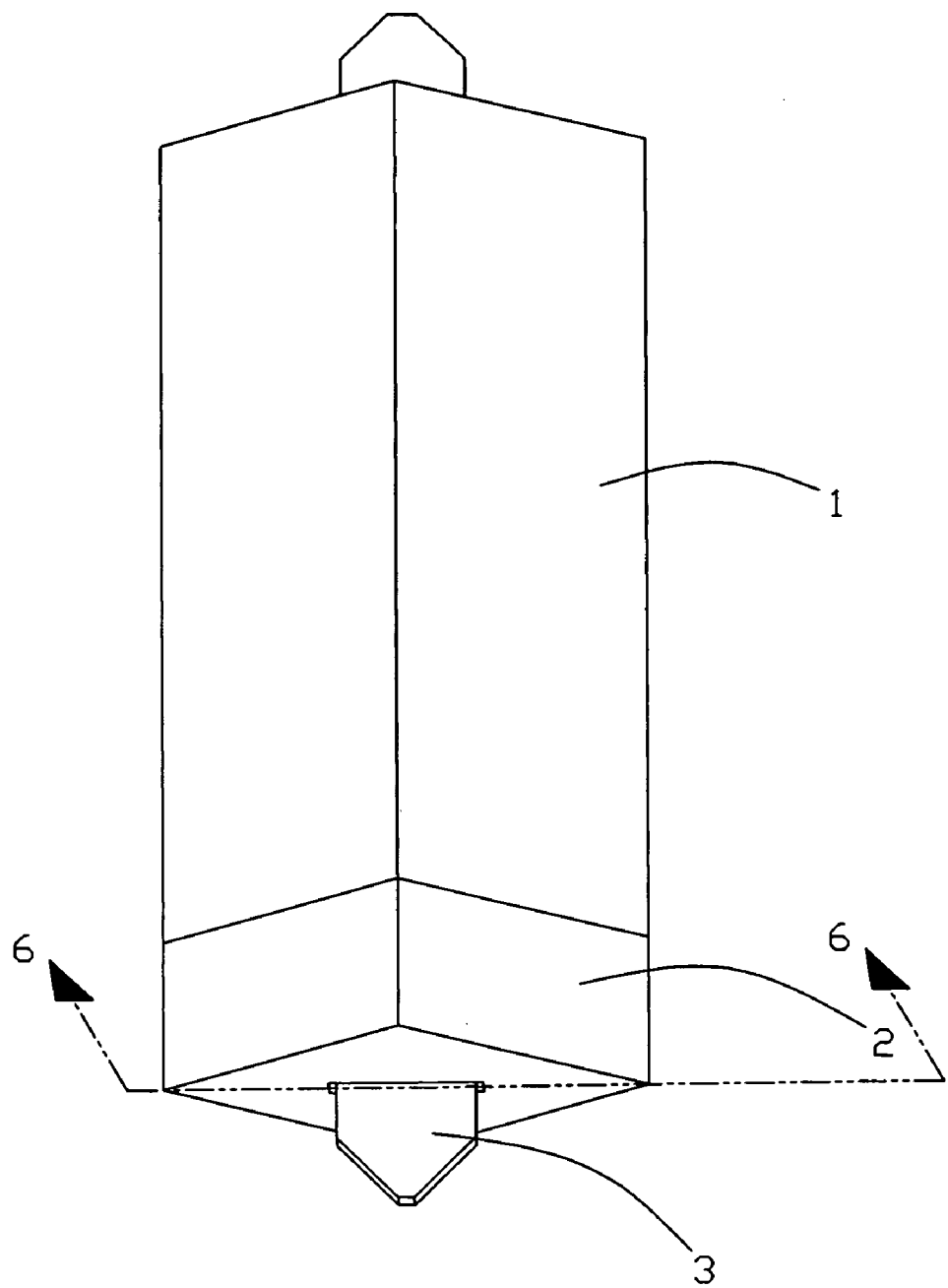
FIG. 1 is an assembled, perspective view of a part of a socket connector in a first preferred embodiment according to the present invention.
Figure 2:
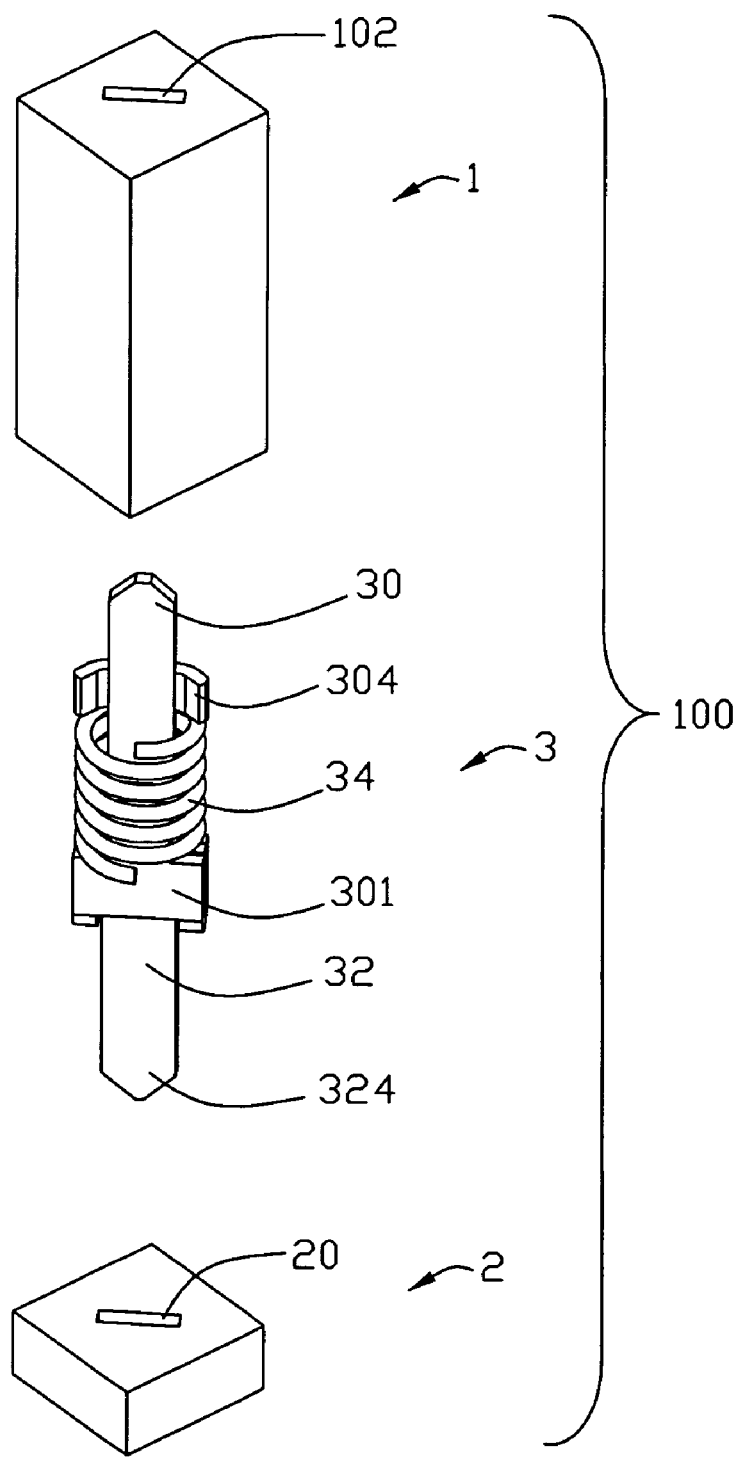
FIG. 2 is a partially exploded, perspective view of the part of the socket connector in FIG. 1.
Figure 3:
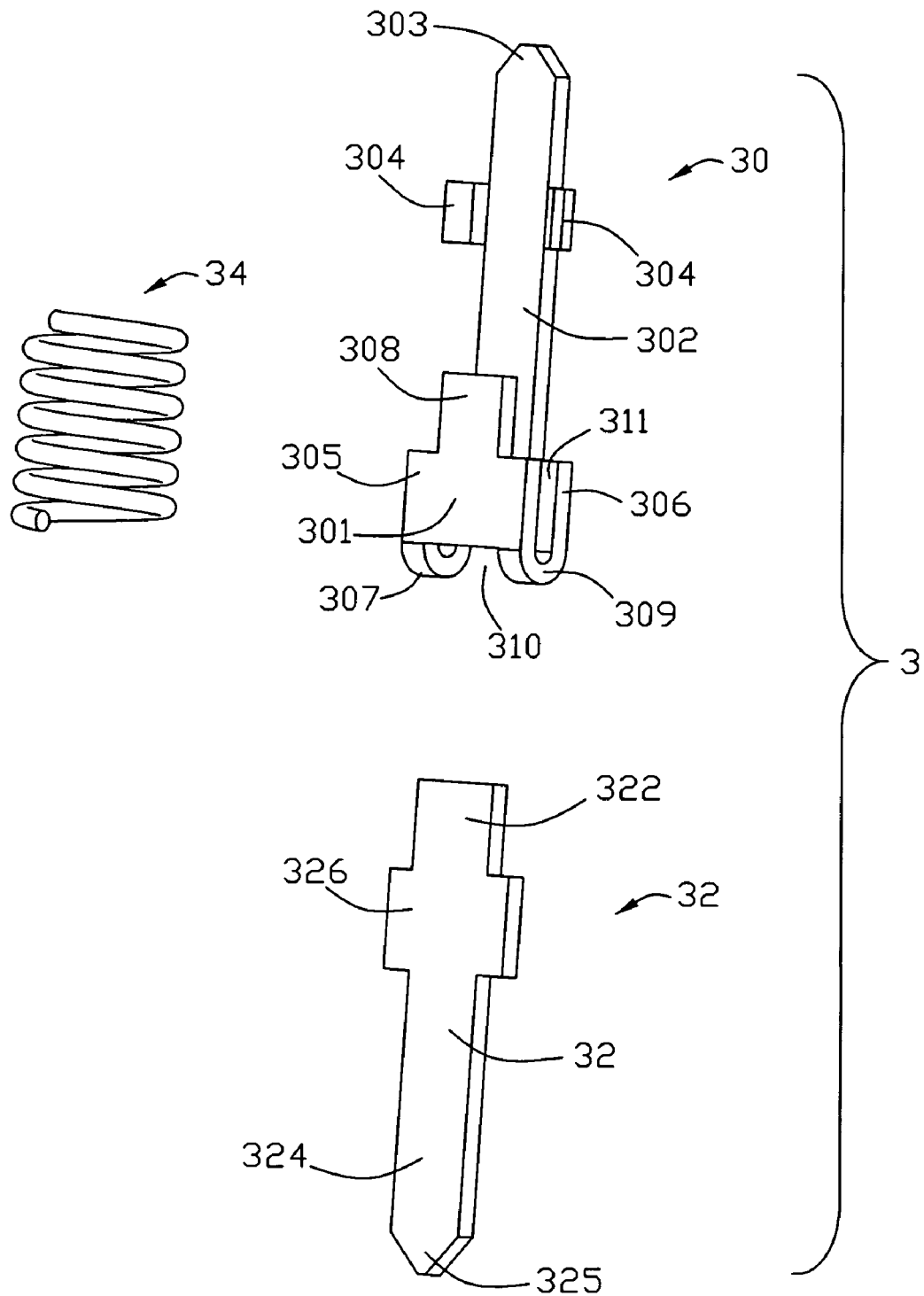
FIG. 3 is an exploded, perspective view of a contact in FIG. 2.

Referring to FIGS. 1-3, a part of a socket connector 100 for testing an IC package (not shown) in a first preferred embodiment according to the present invention is disclosed, the socket connector 100 comprises an upper housing 1, a lower housing 2 and a plurality of contacts 3 (only one is shown) received in the upper housing 1 and the lower housing 2.

The contact 3 has a top contact 30, a bottom contact 32 and a spring 34 disposed between the top contact 30 and the bottom contact 32. The top contact 30 has a keeping portion 301 and a main body 302 upwardly extending from the keeping portion 301. The main body 302 forms a contacting portion 303 at a top end thereof and has a pair of arms 304 laterally protruding from opposed sides of an upper part of the main body 302 and being bent toward the same direction.

The keeping portion 301 substantially has a U-shape taken from a side view. The keeping portion 301 has a rear piece 306, a bend portion 307 forwardly and upwardly bending in 180 degree from a bottom edge of the rear piece 306 and a front piece 305 upwardly extending from the bend portion 307 to face to the rear piece 306. The bend portion 307 connecting bottom edges of the front piece 305 and the rear piece 306. The main body 302 upwardly extends from a center part of an upper edge of the rear piece 306. The front piece 305 is formed with a protruding slice 308 protruding from a center part of an upper edge thereof and facing to the main body 302. Both of the front piece 305 and the rear piece 306 have a smooth inner surface, respectively.

The bend portion 307 has two bend strips 309 with an opening 310 between the strips 309, each strip 309 connects an end of a bottom edge of the front piece 305 with a corresponding part of the rear piece 306. The keeping portion 301 defines a guiding slot 311 between the front piece 305 and the rear piece 306 and communicating with the opening 310.

The bottom contact 32 is substantially in a line-shape and formed with a top part 322, a bottom part 324 with a contacting portion 325 on a bottom end thereof and a dilated part 326 connecting the top part 322 and the bottom part 324. The opening 310 of the top contact 30 is wider than the bottom part 324 but narrower than the dilated part 326, so the bottom part 324 of the bottom contact 32 can pass through the opening 310, while the dilated part 326 can not pass through the opening 310. The spring 34 is helical spring.

Figure 4:
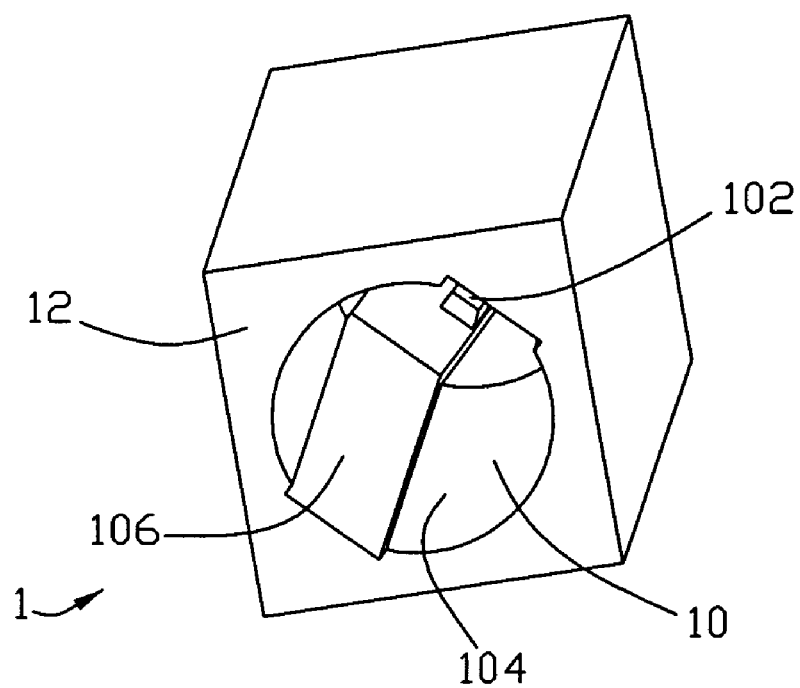
FIG. 4 is an exploded, perspective view of a part of a housing in FIG. 2 taken from a bottom side.
Figure 4:
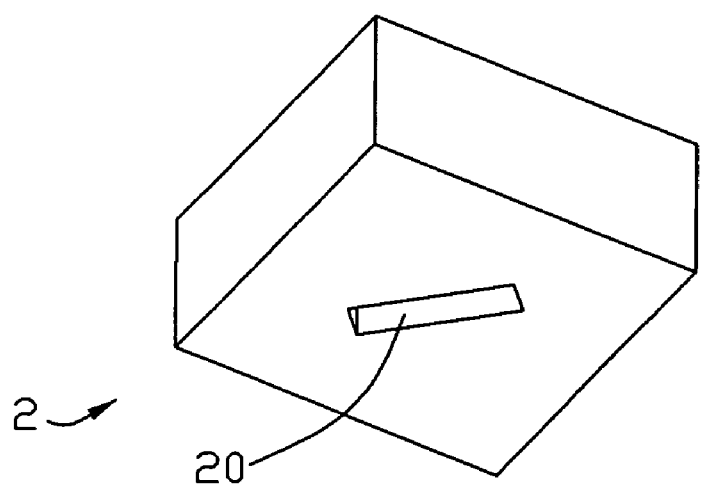
Figure 5:
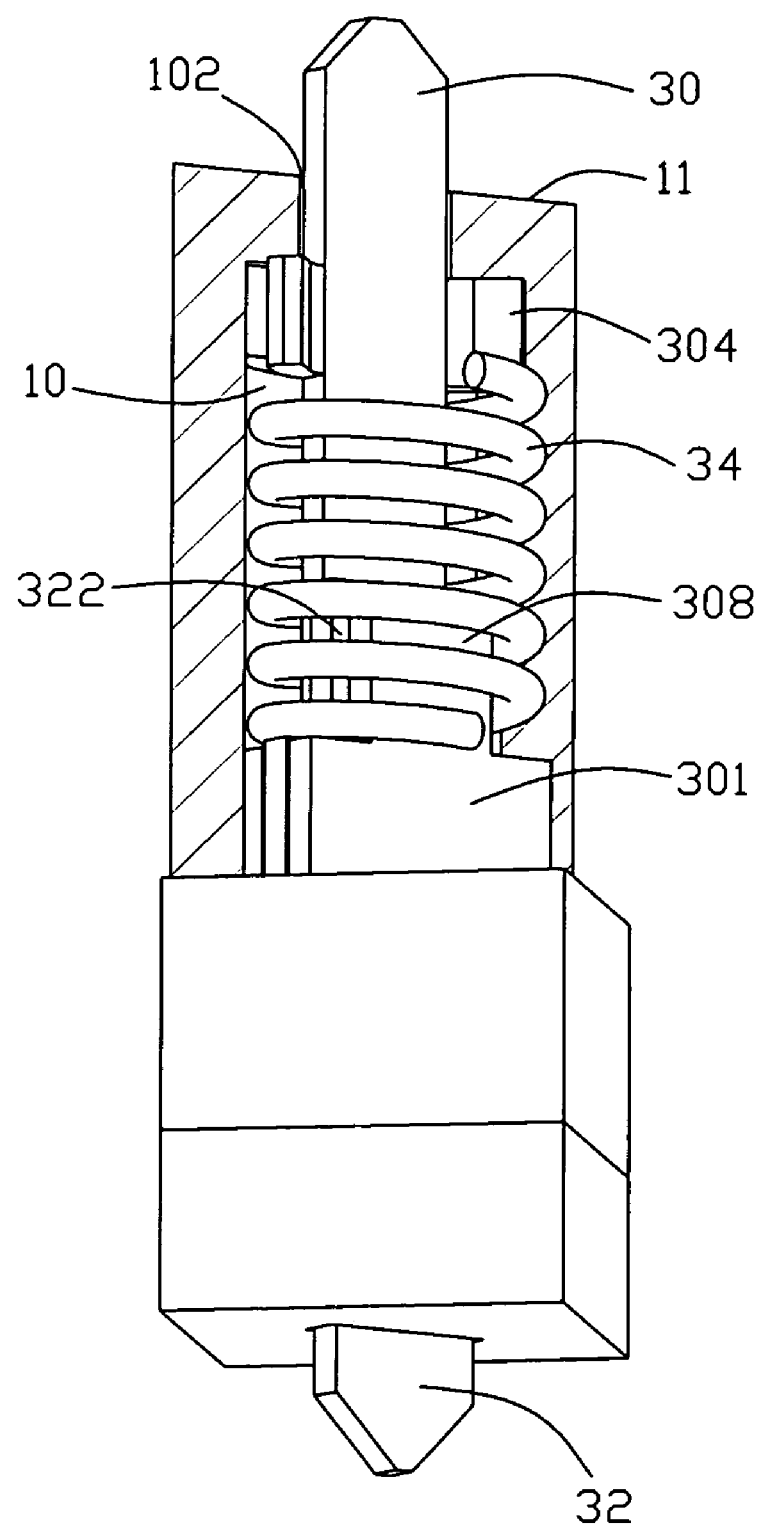
FIG. 5 is a partially sectioned, perspective view of the part of the socket connector in FIG. 1.

Referring to FIGS. 4 and 5, the upper housing 1 defines a plurality of receiving slots 10 for the contacts 3, here only a part of the upper housing 1 with only one receiving slot 10 is shown. The receiving slot 10 has three parts along up-to-down direction, an upper first part is a rectangle narrow gap 102 through a top surface 11 of the upper housing 1, a lower second part is a circle receiving hole 104 through a bottom surface 12 of the upper housing 1, and a third part comprises a pair of substantially rectangle vertical grooves 106 recessed outwardly on two opposed parts of inner side surface of the receiving hole 104. The third part further comprises a rectangle horizontal groove 106 upwardly recessed in an inner top surface of the receiving hole 104 and communicate the vertical grooves 106. The horizontal groove 106 also communicates the gap 102 and the receiving hole 104.

The lower housing 2 is thinner in height direction than the upper housing 1 and also defines a plurality of rectangle through holes 20 for the contacts 3, here only a part of the lower housing 2 with only one rectangle through hole 20 is shown.

Figure 6:
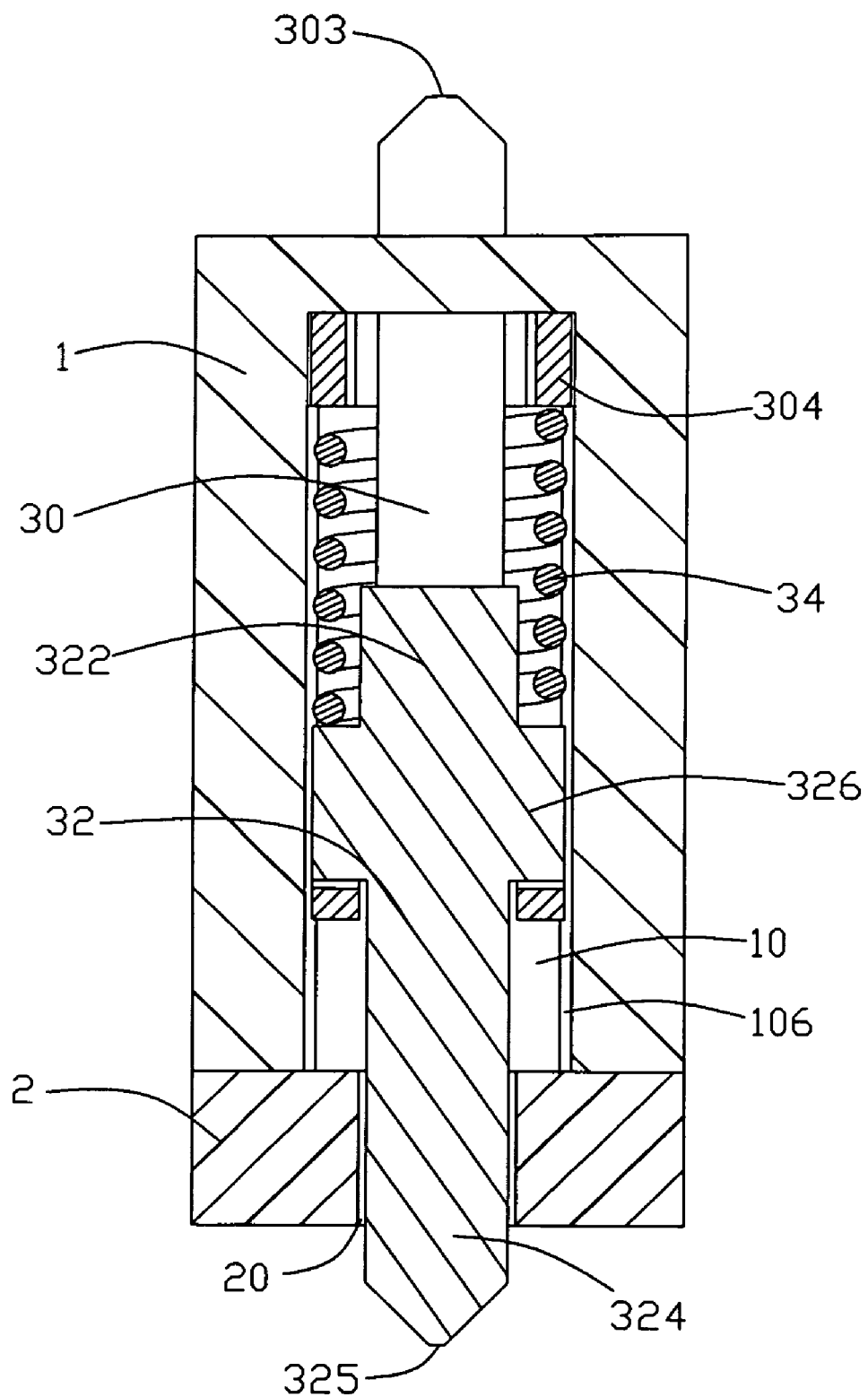
FIG. 6 is a full section view along a line 6-6 in FIG. 1.
Figure 7:
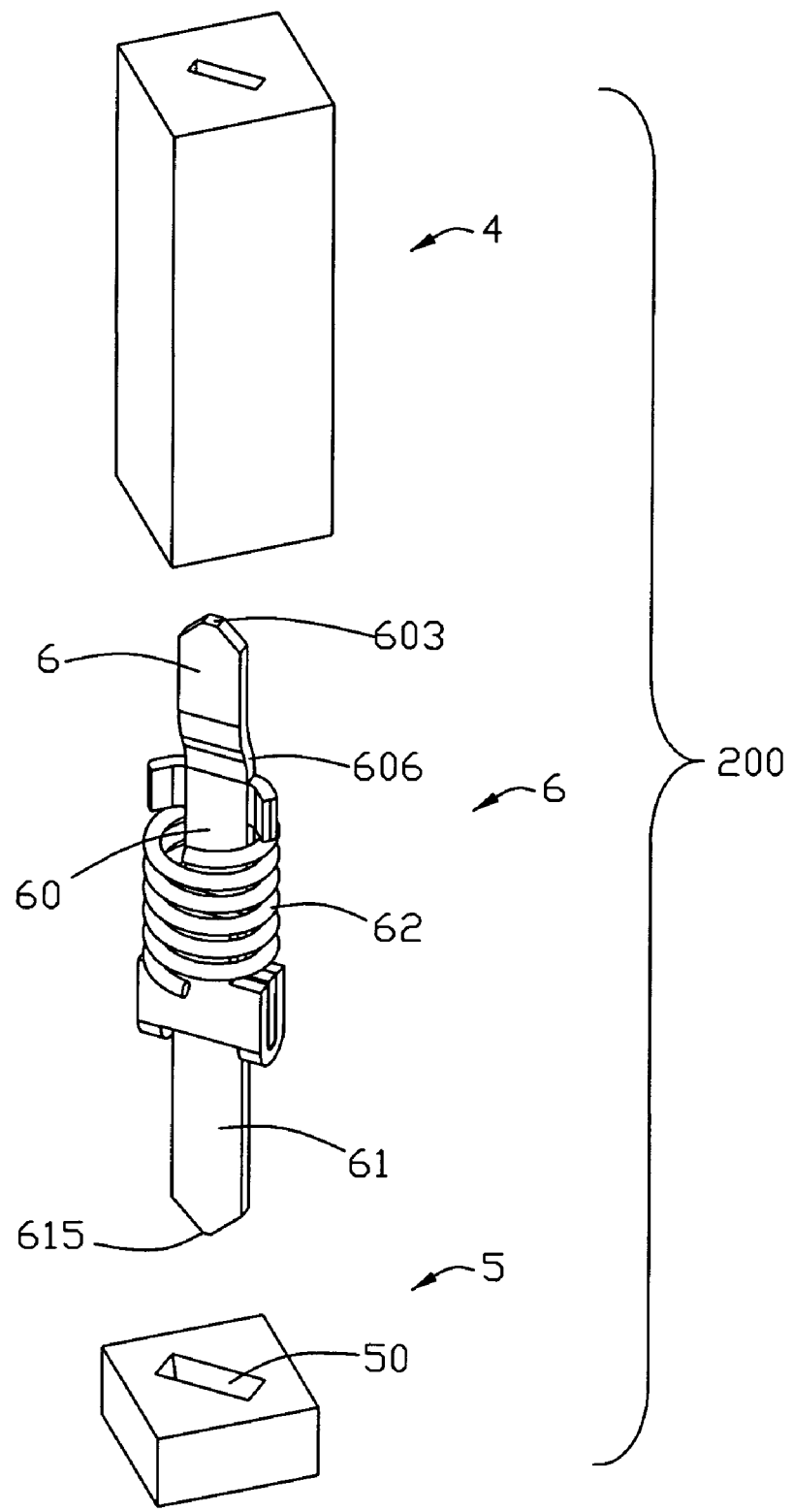
FIG. 7 is a partially exploded, perspective view of a part of a socket connector in a second preferred embodiment according to the present invention.

Referring to FIGS. 2-3, and conjoined with FIGS. 5-6, when assembly, the bottom contact 32 inserts into the guiding slot 311 of the top contact 31 from a top-to-bottom direction, and the bottom contact 32 faces to and sandwiched between the front piece 305 and the rear piece 306 and is movable along the guiding slot 311, the bottom part 324 of the bottom contact 32 passes out of the top contact 30 through the opening 310, and the dilated part 326 is limited in the guiding slot 311 and stopped by the bend portion 307. The top part 322 of the bottom contact 32 faces to the protruding slice 308 of the front piece 305; Then, the spring 34 is downwardly positioned between the arms 304 and the keeping portion 301 of the top contact 30 to surround the protruding slice 308 and the main body 302 of the top contact 31. During this process, the arms 304 are slightly inwardly bent toward each other to let the spring 34 pass through, and two ends of the spring 34 respectively abut against the arms 304 and the keeping portion 301 of the top contact 30.

Then, put the bottom part 324 of the assembly contact 3 into the through slot 20 of the lower housing 2, and put the upper housing 1 upon the lower housing 2, referring to FIGS. 5-6, two lateral sides of the keeping portion 301 of the top contact 30 are movably located in the groove 106 of the upper housing 1, the arms 304 of the top contact 30 abut against an inner top surface of the receiving slot 10, the spring 34 is received in the circle receiving hole 104. The contacting portion 303 of the top contact 30 and the contacting portion 325 of the bottom contact 32 extend beyond the upper housing 1 and the lower housing 2, respectively. So, the assembled contact 3 is received between the upper housing 31 and the lower housing 2.

When the socket connector 100 electrically contacts with the IC package (not shown) and a printed circuit board (not shown). Both of the top contact 30 and the bottom contact 32 can reliably move along the groove 106 relative to each other, synchronously, the arms 304 of the top contact 30 and the dilated part 326 of the bottom contact 32 may compress the spring 34. So when the IC package (not shown) and the printed circuit board (not shown) are removed from the socket connector 100, the spring 34 can force the contact 3 to an original position. The contact 3 is capable of reliably transmitting an electrical signal from a top contact to a bottom contact.

Figure 8:
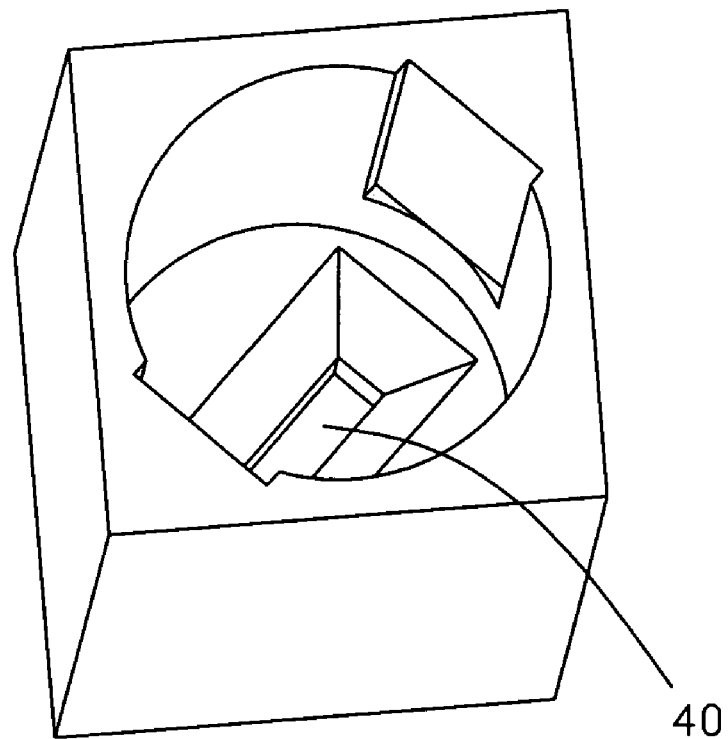
FIG. 8 is a perspective view of a part of an upper housing of the socket connector in FIG. 7.

FIGS. 8-9 disclose another socket connector 200 in a second preferred embodiment according to the present invention, however, only a part of the socket connector 200 is shown. The socket connector 200 has a similar configure as that of the socket connector 100 and is formed with an upper housing 4, a lower housing 5 and a plurality of contacts 6 (only one is shown). The contact 6 has a top contact 60 with a contacting portion 603, a bottom contact 61 with a contact portion 615 and a spring 62. The only difference between the contact 6 and the contact 3 in the socket connector 100 in the first embodiment is that an upper part of the top contact 60 is formed with an inclined portion 606 slanting toward the bottom contact 5, that makes the contacting portion 603 of the top contact and the contact portion 615 of the bottom contact 61 are in a line.

The lower housing 5 has the same configure with the lower housing 2 in the socket connector 100 in the first embodiment, here only a part of the upper housing 1 with only one through hole 50 is shown. The upper housing 4 has similar configure with that of the upper housing 1 in the socket connector 100 in the first embodiment, but a gap 40 for the contacting portion 603 is enlarged at a lower part thereof for receiving the inclined portion 606. So the socket connector 200 is used to electrically connect an IC package (not shown) and a printed circuit board (not shown) with aligned pads, while the socket connector 100 is used to electrically connect the IC package (not shown) and a printed circuit board (not shown) whose corresponding pads have an offset in an upright direction.

Furthermore, although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A socket connector for electrically connecting an IC package and a printed circuit board, comprising:
   a plurality of contacts, each contact having a top contact, a bottom contact and a spring, the top contact formed with a keeping portion and a main body upwardly extending from the keeping portion, the keeping portion having a rear piece, a bend portion forwardly and upwardly bending from a bottom edge of the rear piece and a front piece upwardly extending from the bend portion to face to the rear piece and defining a guiding slot between the front piece and the rear piece; the bottom contact assembled to the top contact and being movable along the guiding slot of the top contact; the spring disposed between the top contact and the bottom contact;
   a lower housing defining a plurality of through gaps for receiving the bottom contacts; and
   an upper housing mounted upon the lower housing and defining a plurality of receiving slots for receiving the top contacts.

2. The socket connector of claim 1, wherein the main body upwardly extends from a center part of an upper edge of the rear piece.

3. The socket connector of claim 2, wherein the bottom contact has a top part, a bottom part with a contacting portion and a dilated part connecting the top part and the bottom part, and wherein the bend portion of the top contact defines an opening for the bottom part passing through and limiting the dilate part in the guiding slot.

4. The socket connector of claim 3, wherein the main body has a pair of arms on two lateral sides of an upper part thereof and a contacting portion on a top end thereof, the arms are bent toward the same direction.

5. The socket connector of claim 4, wherein the front piece is formed with a protruding slice protruding from a center part of an upper edge thereof and facing to the main body.

6. The socket connector of claim 5, wherein the spring surrounds the protruding slice and the main body of the top contact and is compressed by the arms of the top contact and the dilated part of the bottom contact.

7. The socket connector of claim 3, wherein the main body has an inclined portion slanting toward the bottom contact to make the contacting portion of the top contact and the contact portion of the bottom contact are in a line.

8. The socket connector of claim 1, wherein the receiving slot has three parts, a first part is a rectangle narrow gap through a top surface of the upper housing, a second part is a circle receiving hole through a bottom surface of the upper housing for the spring, and a third part comprises a pair of grooves outwardly recessed on two opposed parts of inner side surface of the receiving hole.

9. The socket connector of claim 8, wherein two lateral edges of the keeping portion of the top contact are located in the groove of the upper housing.

10. A socket connector for electrically connecting an IC package and a printed circuit board, comprising:
a plurality of contacts, each contact having a top contact, a bottom contact and a spring, the top contact defining a guiding slot by reversely bending a part of the top contact to make the guiding slot at least have one smooth inner surface; the bottom contact stamped from a metal piece and received into the guiding slot of the top contact in a manner of the bottom contact facing and being movable along the smooth inner surface; the spring disposed between the top contact and the bottom contact;
a lower housing defining a plurality of through gaps for receiving the bottom contacts; and
an upper housing mounted upon the lower housing and defining a plurality of receiving slots for receiving the top contacts.

11. The socket connector of claim 10, wherein the contact has a keeping portion, the keeping portion has a rear piece, a bend portion upwardly bending from a bottom edge of the rear piece and a front piece upwardly extending from the bend portion to face to the rear piece, the guiding slot is defined between the front piece and the rear piece.

12. The socket connector of claim 11, wherein the top contact is formed with a main body upwardly extending from a center part of the rear piece of the keeping portion, the main body has a pair of arms on two lateral sides of an upper part thereof and a contacting portion on a top end thereof, the arms are bent toward the same direction.

13. The socket connector of claim 12, wherein the bottom contact has a top part, a bottom part with a contacting portion and a dilated part connecting the top part and the bottom part, the bend portion of the top contact defines an opening for the bottom part passing through and limiting the dilate part in the guiding slot.

14. The socket connector of claim 11, wherein the spring is located between the arm and the keeping portion of the top contact and surround the guiding slot, the spring is compressed by the arms of the top contact and the dilated part of the bottom contact.

* * * * *